United States Patent [19]
Burkum et al.

[11] Patent Number: 4,697,134
[45] Date of Patent: Sep. 29, 1987

[54] APPARATUS AND METHOD FOR MEASURING BATTERY CONDITION

[75] Inventors: Merlin E. Burkum, Elmhurst; Charles M. Gabriel, Lombard, both of Ill.

[73] Assignee: Commonwealth Edison Company, Chicago, Ill.

[21] Appl. No.: 892,793

[22] Filed: Jul. 31, 1986

[51] Int. Cl.$^4$ .................. G01N 27/46; H02J 7/00
[52] U.S. Cl. ...................... 320/48; 324/430; 340/636
[58] Field of Search ............ 320/21, 39, 40, 43, 320/48; 324/430; 340/636

[56] References Cited

U.S. PATENT DOCUMENTS

| | | | |
|---|---|---|---|
| 3,234,538 | 11/1961 | Parke | 340/249 |
| 3,278,823 | 7/1963 | Ross | 320/23 |
| 3,392,328 | 3/1965 | Figg | 324/29.5 |
| 3,424,969 | 7/1966 | Barry | 320/21 |
| 3,500,167 | 12/1966 | Applegate et al. | 320/14 |
| 3,629,704 | 12/1971 | Stevens | 324/158 |
| 3,676,770 | 7/1972 | Sharaf et al. | 324/29.5 |
| 3,753,094 | 8/1973 | Furuishi et al. | 324/29.5 |
| 3,808,487 | 4/1974 | Feuillade | 320/21 |
| 3,816,807 | 6/1974 | Taylor | 320/20 |
| 3,873,911 | 3/1975 | Champlin | 324/29.5 |
| 3,984,762 | 10/1976 | Dowgiallo, Jr. | 324/29.5 |
| 3,997,888 | 12/1976 | Kremer | 340/249 |
| 4,044,300 | 8/1977 | Dupuis et al. | 324/29.5 |
| 4,134,060 | 1/1979 | Feldman | 324/29.5 |
| 4,193,025 | 3/1980 | Frailing et al. | 324/427 |
| 4,217,645 | 8/1980 | Barry et al. | 364/483 |
| 4,223,363 | 9/1980 | Santis et al. | 361/18 |
| 4,259,639 | 3/1981 | Renirie | 324/430 |
| 4,433,294 | 2/1984 | Windebank | 320/48 X |

OTHER PUBLICATIONS

Battery Impedance: Farads, Milliohms, Microhenrys by E. Willihnganz and Peter Rohner, pp. 259-262, dated Sep. 1959.

Primary Examiner—R. J. Hickey
Attorney, Agent, or Firm—Willian Brinks Olds Hofer Gilson & Lione Ltd.

[57] ABSTRACT

A testing device measures the impedance of secondary cells that form a battery, such as a lead acid battery, while the battery is in a float charge condition and connected to an active electrical load. The impedance measurement is made at a frequency selected to be different from those frequencies otherwise present in the charger-load circuit. A first application of the testing device monitors the battery for a change in impedance that can signal a developing defect in one or more individual cells or intercell connections that can prevent the battery from delivering its stored energy to the load. In a second application, the testing device is used to compare the impedance of individual cells and electrical connections to locate faulty components.

47 Claims, 6 Drawing Figures

APPARATUS AND METHOD FOR MEASURING BATTERY CONDITION

BACKGROUND OF THE INVENTION

This invention relates to methods and devices for measuring the impedance of batteries and battery components.

Secondary batteries in stationary applications are used at electric generating stations, substations, and industrial plants to perform the vital functions of circuit breaker tripping and automatic switching, to provide for the orderly shutdown of generating units in an emergency, including the starting of emergency diesel-generators, and to power other similar tasks. Applications requiring a longer-term delivery of battery energy include emergency lighting for plants and hospitals, and supplying uninterrupted power for computer and communication equipment. Batteries must be ready to deliver their stored energy on demand to accomplish these tasks. Although batteries are reliable, a failure to supply the required energy would often result in serious consequences.

Battery systems used for these applications are often made up of individual, series-connected cells; electric utility installations generally consist of 24, 60, or 120 individual 2-volt cells connected together to provide 48, 120, or 240 VDC. The normal, steady-state load of sensors, indicating lights, relay coils, and electronic apparatus is supplied by a charger connected to the battery terminals. The charger also maintains the battery in a fully-charged state (i.e., electrolyte specific gravity of 1.230 for a typical lead-acid battery). This is known as float-charge operation. The normal load supplied by these batteries is complex, and varies with time. It is often not possible to disconnect these loads for test purposes without interrupting the main circuits they control.

The battery terminal voltage or the specific gravity of each cell making up a battery are indicators which have been used to determine battery state-of-charge. It is standard industry practice to take periodic specific gravity measurements and to conduct visual and other checks. However, specific gravity readings do not entirely indicate a battery's ability to supply power. For example, the specific gravity of each cell in a battery may indicate a fully-charged ready state, but a high impedance in one intercell connection can prevent the battery from functioning as intended.

Load discharge tests can be used to prove a battery's ability to perform. A discharge test is specified by the Nuclear Regulatory Commission (NRC) Regulations 0123 (BWR) and 0452 (PWR) for each critical battery of a nuclear generating unit. The test must be performed each time a unit is refueled. Each discharge reduces the remaining service life of a battery and may cause deterioration which can ipair the battery's ability to function next time in an on-line situation. A load discharge test may indicate trouble, but it will often not locate it.

It is important to have an in-service indication that a battery is able to deliver its stored electrochemical energy when required, and also a means for locating an abnormal condition while the battery remains in service. Routine visual inspections, specific gravity readings, voltage readings, and periodic equalizing charge are all used to keep the battery ready to perform. Measurement and testing devices have been developed for relatively simple systems which give indications of a battery's ability to deliver its stored energy.

One example described in U.S. Pat. No. 3,873,911 to Champlin utilizes an AC method at 100 Hz and low current (milliamperes) to obtain a measurement of what the patent defines as dynamic resistance. Dynamic resistance as defined by Champlin is inversely proportional to the dynamic power—an indicator of the battery's condition and state-of-charge. The disclosed method is primarily designed for testing a single automotive battery. In the disclosed Champlin system the battery to be tested is isolated from any external electrical load since a determination of the dynamic resistance/power is dependent on a measurement made using the battery's own open-circuit voltage. For this reason, any significant load on the battery during the test can distort the measurement.

U.S. Pat. No. 3,676,770 to Sharaf describes a system for indicating the charge remaining in a battery, specifically a battery for a fork lift truck, while the battery is supplying a load. For the first 75% of the battery's energy discharge, the charge level is indicated by an expanded-scale voltmeter. This measurement is used due to low initial values of battery resistance. For the remaining 25% of the charge, the battery's internal resistance increases sufficiently so that it can be compared to a reference resistance. The measurement system uses short-duration pulses of voltage or current spaced seconds apart and is powered by the battery. Typical stationary batteries on float-charge service are characterized by lower resistance and larger capacitance than those typically encountered in fork lift truck batteries. These differences reduce the reliability of measurements made in the manner described by Sharaf. Also, the charging system normally used in stationary applications produces a ripple current that contains harmonics which interact with the additional capacitance of connected cables and filters. Such additional capacitance can distort pulses, introduce spurious signals and noise, and interfere with the use of pulse timing to measure low values of battery resistance.

Another example is described by U.S. Pat. No. 3,753,094 to Furuishi which utilizes a 100 Hz AC signal at low current to measure battery internal impedance. The Furuishi patent, like the Champlin patent, provides no suggestion as to how to measure the resistance of a battery which is simultaneously connected to an active load and a battery charger. Rather, Furuishi discloses the use of blocking capacitors to prevent a flow of direct current from the battery. The object of the Furuishi device is to provide a means for checking the impedance and hence quality of a battery during the manufacturing process.

Any system that measures battery impedance must contend with the cell-to-cell variations of this characteristic. Each individual cell in a battery has a unique electrical impedance caused by manufacturing variations. For critical applications, individual cell impedances are measured when manufactured and those which closely match are selected for a battery. Normally, individual cell impedances fall within a relatively narrow range of values. This variation in individual cell impedance makes it desirable to secure a "signature" initial value of cell impedance and later to use this value to detect changes. The impedance of the entire battery varies with the sum of individual cell impedances and can be treated in a similar manner. During the service life of an individual cell, its impedance may increase, but the overall change in battery impedance may be quite small. Impedance changes may be due to reduction in charge state or may indicate a developing defect which could impair battery performance.

In measuring the impedance of a stationary secondary battery, the measuring system must contend with large capacitance values. In their September, 1959 IEEE paper entitled "Battery Impedance: Farads, Milliohms, Microhenrys", Willinganz and Rohner report that the apparent capacitance values range from 1 farad to several hundred farads, depending on battery size and test frequency. The resistance will be 0.1 to 10 milliohms, while the inductance will be less than 0.1 microhenry. It is important to consider the magnitude of these quantities when using impedance changes to determine battery condition.

It is therefore an object of the present invention to detect changes in the overall impedance of a multicell secondary storage battery, including the intercell connectors, by the continuous measurement and monitoring of the terminal to terminal impedance while the battery is floatcharged and connected to an active load.

It is also an object of the present invention to locate a defect in an individual cell of a multicell secondary storage battery, including during periods when the battery is on float charge and connected to an active electrical load.

It is another object of the present invention to locate electrical connections external to the individual cells that have impedances much greater than the statistical norm, including during periods when the battery is on float charge and connected to an active electrical load.

It is still a further object of the invention to provide a test apparatus and procedure for determining and predicting a secondary storage battery's ability to supply power to a load, including during test periods when the storage battery is on float charge and connected to an active load.

SUMMARY OF THE INVENTION

According to the apparatus of this invention, a battery monitor is provided which comprises an AC signal generator adapted to generate an AC signal at a selected frequency. The AC signal is applied across a first pair of contacts of a battery, and means are provided for determining first and second Ohms-law-related parameters indicative of impedance across a second pair of contacts of the battery. This determining means comprises means for supplying an input signal indicative of the first Ohms-law-related parameter, filter means coupled to the supplying means for passing components of the input signal at the selected frequency and for attenuating at least components of the input signal in an attenuation frequency range greater than the selected frequency. This filter means operates to generate a filtered output signal which is measured to determine the first Ohms-law-related parameter. In the embodiments described below, the two Ohms-law-related parameters are current and voltage, but in alternate embodiments other parameters, such as dissipated power across a resistor, may well be substituted.

This invention is particularly useful in monitoring the condition of a battery while the battery is connected both to a battery charger and to an active electrical load. Typically, such a charger and active load will cause AC currents to flow through the battery at a number of characteristic frequencies, such as harmonics and subharmonics of the AC source which powers the charger. Preferably, the selected frequency of the AC signal generator is spaced from these characteristic frequencies, and the filter operates to block the characteristic frequencies while passing the selected frequency. In this way, the measurement of the Ohms-law-related parameter is made substantially independent of currents in the battery resulting from the charger and the active load.

According to the method of this invention, the impedances of a plurality of components of a battery are compared while the battery is electrically connected to a charger and an active load. The battery is of the type comprising a pair of battery output terminals and a plurality of cells electrically connected between the battery output terminals, and each of the components comprises a pair of electrical contacts. According to this method, an AC current of a known magnitude is passed through the battery across the battery output terminals. This AC current has a selected frequency. A first voltage signal indicative of the AC voltage across the pair of electrical contacts of a first one of the components is obtained and passed through a filter operative to pass components of the first voltage signal at the selected frequency and to attenuate components of the first voltage signal in an attenuation frequency range which includes frequencies greater than the selected frequency. Then the filtered first voltage signal is measured to obtain a first voltage measurement and the first voltage measurement is combined with the known magnitude of the current to obtain a first impedance value. These steps are then repeated with a second voltage signal indicative of the AC voltage across the pair of electrical contacts of a second one of the components to obtain a second impedance value, and the first and second impedance values are then compared with one another.

This method allows the impedance of individual components of the battery to be measured and assessed while the battery is connected to both a charger and an active load. As with the apparatus of this invention, the use of a filter which passes signals at the selected frequency of the AC current and attenuates other frequencies allows an accurate measurement to be obtained without removing the battery from service.

The invention itself, together with further objects and attendant advantages, will best be understood by reference to the following detailed description, taken in conjunction with the accompanying drawings.

DETAILED DESCRIPTION OF THE PRESENTLY PREFERRED EMBODIMENTS

The preferred embodiments described below are designed for use in two modes of operation. The first mode is that of a battery condition monitor used to monitor the impedance of a multicell secondary battery continuously in order to measure its ability to deliver stored energy to a connected load, and also to give a warning of developing trouble. The second mode is that of a diagnostic tool used to determine the location of a high impedance individual cell or intercell connection of the battery. In both modes of operation, the battery under test preferably remains connected to a battery charger which continues to supply the normal electrical load and to maintain the battery at float charge level. All of the embodiments described below utilize an AC signal generator having a specially selected frequency for measuring the impedance of the battery and its components.

Figure 1A:
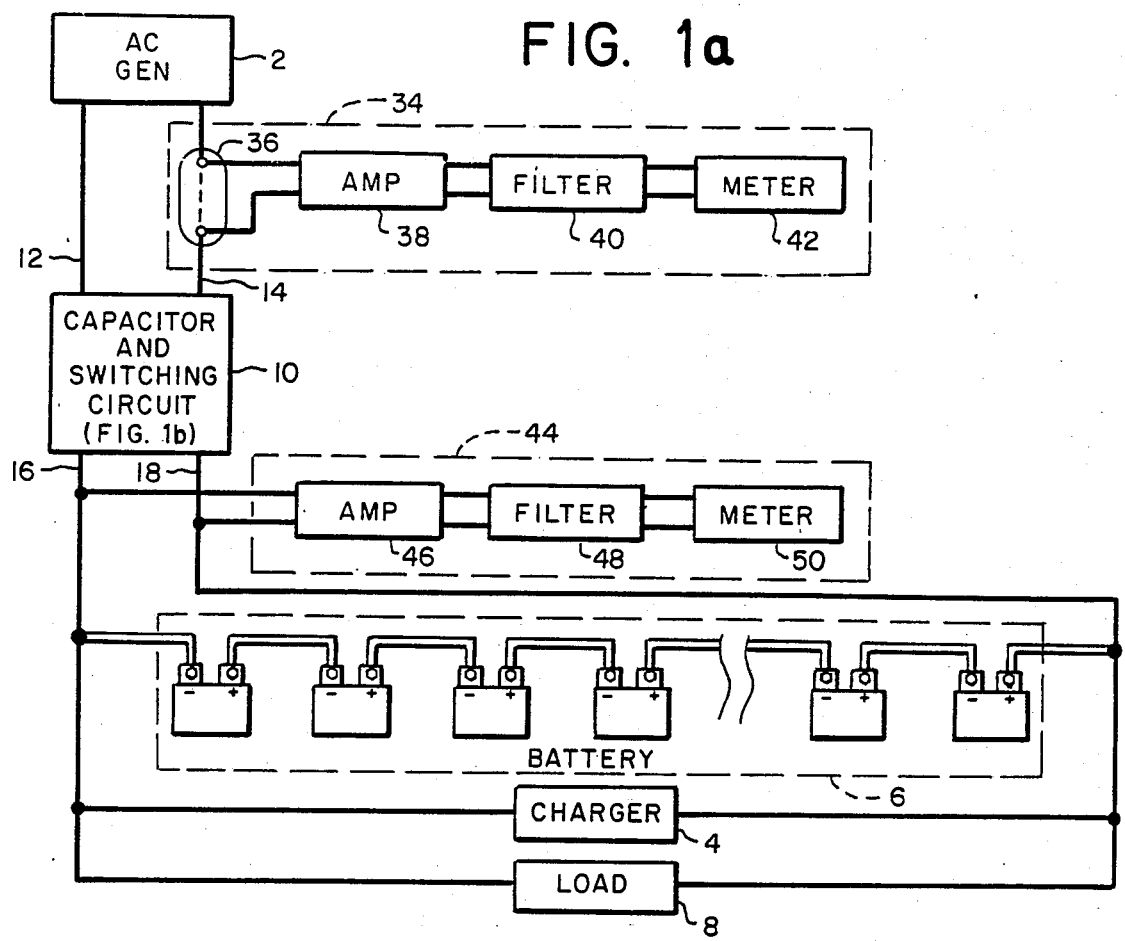
FIG. 1a is a schematic circuit diagram of the capacitor and switching circuit of FIG. 1.
Figure 1B:
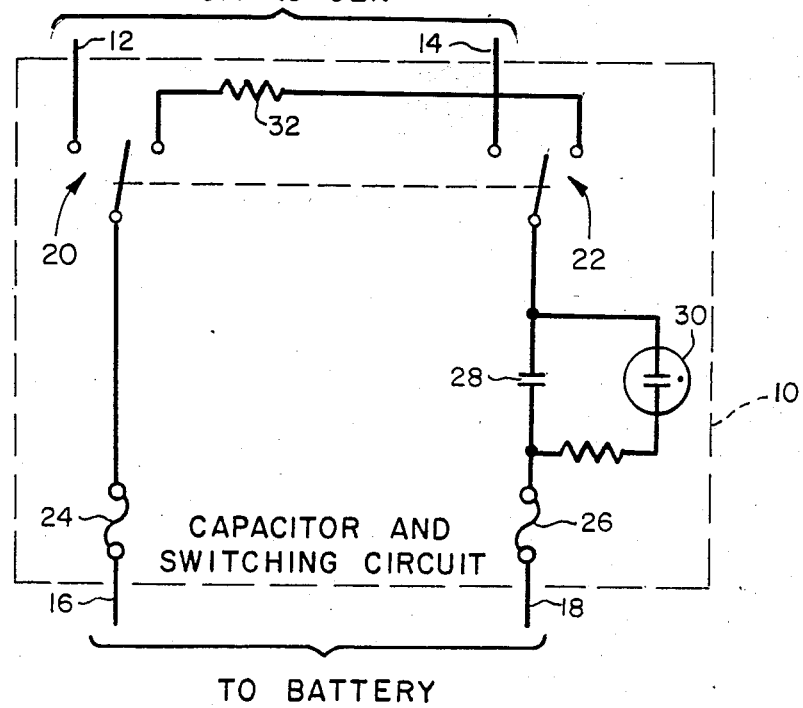
FIG. 1 is a schematic circuit diagram of a first presently preferred embodiment of the battery condition monitor of this invention, which measures and continuously monitors the impedance of a multicell secondary storage battery, terminal-to-terminal.
Figure 2:
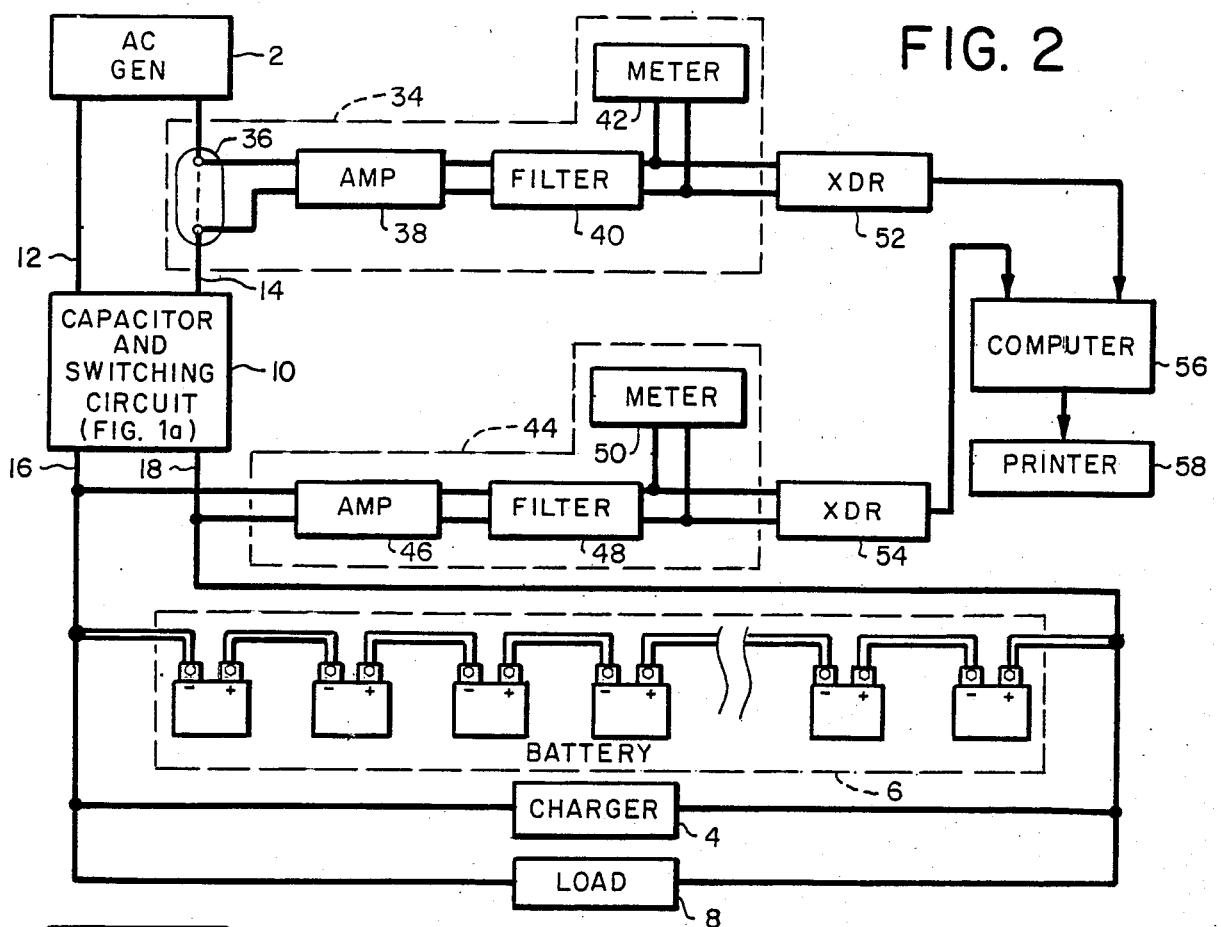
FIG. 2 is a schematic circuit diagram of a second preferred embodiment of the battery condition monitor of this invention, which utilizes a computer to calculate and record battery impedance automatically.

The embodiments of FIGS. 1 and 2 operate as a battery condition monitor to measure and display the battery impedance at all times while the battery is on float charge and connected to an active load. Typically, a 2% increase in total battery impedance may signal developing trouble, and further testing of individual cells and connections of the battery should be performed to determine the cause of any such increase in total battery impedance.

Referring to FIG. 1, the first preferred embodiment of this invention is used the measure the total impedance of a battery 6 while it is connected in circuit with a battery charger 4 and an active electrical load 8. The charger 4 is powered by an AC supply source (not shown) which typically operates at either 60 or 50 Hz. For this reason, the DC current supplied by the charger 4 will typically have a ripple current component which often ranges between 3 and 5% of the amplitude of the DC voltage. This ripple current component of the voltage supplied by the charger 4 is largely distributed at harmonics and subharmonics of the fundamental frequency of the AC supply source. The load 8, depending upon its particular electrical characteristics, can create further AC components on the voltage placed across the battery 6 by the charger 4. For example, commonly utilized frequencies such as 400 or 1000 Hz may often be associated with the electrical load 8. In the circuit of FIG. 1, the charger is both supplying current to the electrical load 8, as well as maintaining the battery 6 in a float charge condition.

The embodiment of FIG. 1 includes an AC sine wave generator 2 which generates an AC signal that is supplied across the battery 6 via a capacitor and switching circuit 10. In this embodiment, the amperage of this AC signal is regulated by the AC generator 2 to preferably within 0.5% of the desired value. Furthermore, the frequency of the signal supplied by the AC generator 2 is held constant, in this embodiment at 25 Hz. Because the battery 6 presents an extremely low impedance path as compared to that of the charger 4 and the load 8, a large majority of the current supplied by the AC generator 2 flows through the battery 6. For this reason, any measurement of the voltage across the battery 6 at the frequency of the generator 2 is consistently proportional to the impedance of the battery 6.

FIG. 1a shows a detailed schematic diagram of the capacitor and switching circuit 10 of FIG. 1. This circuit 10 includes first and second inputs 12,14 and first and second outputs 16,18. The first and second inputs 12,14 receive the AC signal generated by the AC generator 2, and the first and second outputs 16,18 are connected across the output terminals of the battery 6.

The circuit 10 includes first and second switches 20,22. The common pole of the first switch 20 is connected via a fuse 24 with the first output 16, and the common pole of the second switch 22 is connected via the series combination of a second fuse 26 and a capacitor 28 with the second output 18. A neon bulb 30 is connected in parallel across the capacitor 28.

When the switches 20,22 are in the central position shown in FIG. 1a, the inputs 12,14 are isolated from the outputs 16,18, and the outputs 16,18 are isolated from each other. When the switches 20,22 are moved to a first position (to the right as shown in FIG. 1a) the first and second outputs 16,18 are interconnected via a resistor 32, the capacitor 28, and the fuses 24,26. When the switches 20,22 are moved to a second position (to the left as shown in FIG. 1a), the first input 12 is interconnected with the first output 16 via the first fuse 24, and the second input 14 is interconnected with the second output 18 via the capacitor 28 and the second fuse 26.

From the foregoing description it should be apparent that the AC generator 2 and the capacitor and switching circuit 10 can be used to pass an AC signal of a regulated amplitude and a known frequency through the battery 16.

The embodiment of FIG. 1 includes an ammeter 34 which operates to measure the amperage of the AC signal supplied by the AC generator 2. This ammeter 34 includes a shunt resistor 36 interconnected between the second input 14 of the circuit 10 and the AC generator 2. The voltage drop across this shunt resistor 36 is amplified by an amplifier 38, and the resulting signal is supplied as an input to a bandpass filter 40. This bandpass filter 40 is tuned to the same frequency as that of the AC generator 2, and it operates to pass signals at the selected frequency while blocking signals having frequencies either above or below the selected frequency. The amplitude of the resulting filtered signal is then measured with a meter 42.

The embodiment of FIG. 1 also includes a voltmeter 44 connected to measure the voltage across the first and second outputs 16,18. This voltmeter 44 includes an amplifier 46, a filter 48, and a meter 50 which operate similarly to the corresponding components of the ammeter 34.

The following information is provided merely by way of example in order better to define the best mode of this invention. The AC generator 2 of FIG. 1 can be implemented with a wide variety of circuits. The power frequency converter supplied by Diego Power (San Diego, Calif.) as Model 1011-9 has been found to be suitable. In this embodiment, the AC generator 2 is adjusted to supply a current of 1 amp at a frequency of 25 Hz. The capacitor 28 in this embodiment is preferably a 6000 microfarad capacitor rated for a working voltage of 300 VDC. The fuses 24,26 in this embodiment are 10 amp fuses, and the resistor 32 is a 10 K Ohms, 12 watt resistor. In this embodiment the shunt 38 is preferably a 50 amp, 50 millivolt shunt, and the amplifier 38, filter 40, and meter 42 can be obtained as a single unit identified by General Radio of Concord, Mass., as Model No. 1564. General Radio Model No. 1564 can also be used for the amplifier 46, the filter 48 and the meter 50. Preferably, the filters 40,48 are both centered at 25 Hz in this embodiment, and the filters 40,48 provide more than 40 dB attenuation for all frequencies below 12.5 Hz or greater than 50 Hz. The amplifiers 38,46 should of course be capable of withstanding the DC voltage of the battery 6.

The frequency distribution of harmonic signal components normally present in the charger-load combination should be considered carefully when selecting the frequency of the generator 2 and the filters 40,48. This is because the amplitude of such harmonic components typically varies in time. For this reason, any harmonic components flowing through the battery 6 and having a frequency close to that of the generator 2 will contribute to errors in the impedance measurement.

In this embodiment the frequency of the AC current supplied by the generator 2 has been selected to avoid harmonics or subharmonics originating in the output of the charger 4, and also those frequencies which are commonly used in the electrical load 8, such as 400 and 1000 Hz. The frequency of the AC generator 2 for any particular charger-load combination can be selected after first analyzing the power spectrum of the voltage across the battery 6. The AC generator 2 should then be tuned to operate at a frequency characterized by consistently low power. In most applications, when the charger 4 is powered by a 60 Hz AC power source, a frequency of 11-14, 21-29 or 91-109 Hz can be used for the AC generator 2 and the filters 40,48. At present, a frequency of 25 Hz is preferred for these applications. When the charger 4 is powered by an AC power source operating at 50 Hz, it is often preferable to set the AC generator 2 and the filters 40,48 for 30 or 120 Hz.

In this preferred embodiment the current supplied by the generator 2 to the battery 6 is preferably limited to 1 ampere to avoid undesirable effects on the battery 6, yet to provide a sufficient current to allow an accurate and precise measurement of the impedance across the battery 6. A regulated current of exactly 1 ampere has one important benefit, in that any voltage reading obtained with the voltmeter 44 will equal the impedance of the battery in Ohms. The capacitor 28 is provided to isolate the AC generator 2 from direct current supplied by the battery 6. In alternative embodiments, where the current regulation of the AC generator 2 is sufficiently reliable, the ammeter 34 can be eliminated. Preferably, the voltmeter 44 should be sufficiently accurate and sensitive to display measurements in the low millivolt range and to indicate changes of as little as 1 or 2 millivolts, which may be indicative of developing problems with the battery 6.

In operation, the embodiment of FIG. 1 is used as follows. First, the switches 20,22 are placed in the central position as shown in FIG. 1a, and the outputs 16,18 are connected across the output terminals of the battery 6, as shown in FIG. 1. Because the outputs 16,18 are isolated from one another and from the AC generator 2 when the switches 20,22 are in the central position, the possibility of arcing is minimized. Once the outputs 16,18 have been connected across the battery 6, the switches 20,22 are then moved to the first position (to the right as shown in FIG. 1a). This establishes a current path between the outputs 16,18 through the resistor 32 and the capacitor 28, thereby charging the capacitor 28 to the working voltage of the battery 6. A sufficient charge on the capacitor 28 is indicated by the neon bulb 30. Once the capacitor 28 has been charged, the switches 20,22 can be moved to the second position (to the left as shown in FIG. 1a). In this second position the AC generator 2 applies a sinusoidal AC current across the battery 6. As explained above, this current is preferably regulated at a magnitude of 1 ampere. The meter 50 of the voltmeter 44 can then be read directly to determine the impedance of the battery 6.

It is important to recognize that this impedance measurement is made while the battery 6 is interconnected with both the charger 4 and the active load 8. Because the filter 48 is tuned to the same frequency as that of the signal supplied by the AC generator 2, and because this frequency is selected to avoid characteristic frequencies in the power spectrum of the charger 4 and the load 8, a reliable measurement of battery impedance is obtained. The ammeter 34 can be used to check the amperage of the AC signal supplied by the AC generator 2 to allow adjustment of this amperage if necessary.

FIG. 2 shows a schematic diagram of a second preferred embodiment of this invention which is similar in many respects to the first preferred embodiment described above. Corresponding reference numerals have been used for corresponding elements in the two embodiments. Because elements 2-50 of the two embodiments are identical, they will not be described again here. Rather, the following discussion will focus only on the differences between the two embodiments.

In the embodiment of FIG. 2 the filtered signal supplied by the filter 40 to the meter 42 of the ammeter 34 is sampled and digitized by a transducer 52, and then supplied as an input to a computer 56. Similarly, the filtered signal supplied by the filter 48 to the meter 50 in the voltmeter 44 is also sampled and digitized by a transducer 54 and supplied as a second input to the computer 56. Thus, the computer is supplied with a digitized measurement of the measured AC current at the selected frequency by the transducer 52, and of the measured voltage across the battery 6 at the selected frequency by the transducer 54. The computer 56 is programmed to divide the voltage measurement by the current measurement and to print the resulting impedance value on a printer 58 on a regular basis. Thus, the computer 56 repeatedly measures and displays the impedance of the battery 6. Because the embodiment of FIG. 2 divides the voltage measurement by the current measurement, it is not necessary for the AC generator to provide a regulated current as described above. Simply by way of example, the signal sampling and digitizing system marketed by Keithley as Model No. 197 can be used for the transducers 52,54.

The first and second embodiments of FIGS. 1 and 2 provide a substantially continuous indication of the condition of the battery 6, while the battery 6 is connected to both the charger 4 and the load 8. These embodiments may be used to supplement the standard industry practice of periodic visual and other checks of the condition of a secondary battery. These embodiments can be used to detect developing trouble in the battery 6, whether it results from increased impedance of an individual cell, or increased impedance of an intercell connection. As described below, the third embodiment of FIG. 3 can then be used to locate the particular cell or intercell connection that has resulted in an increase in battery impedance, again without requiring that the battery 6 be isolated from the charger 4 or the load 8.

Figure 3:
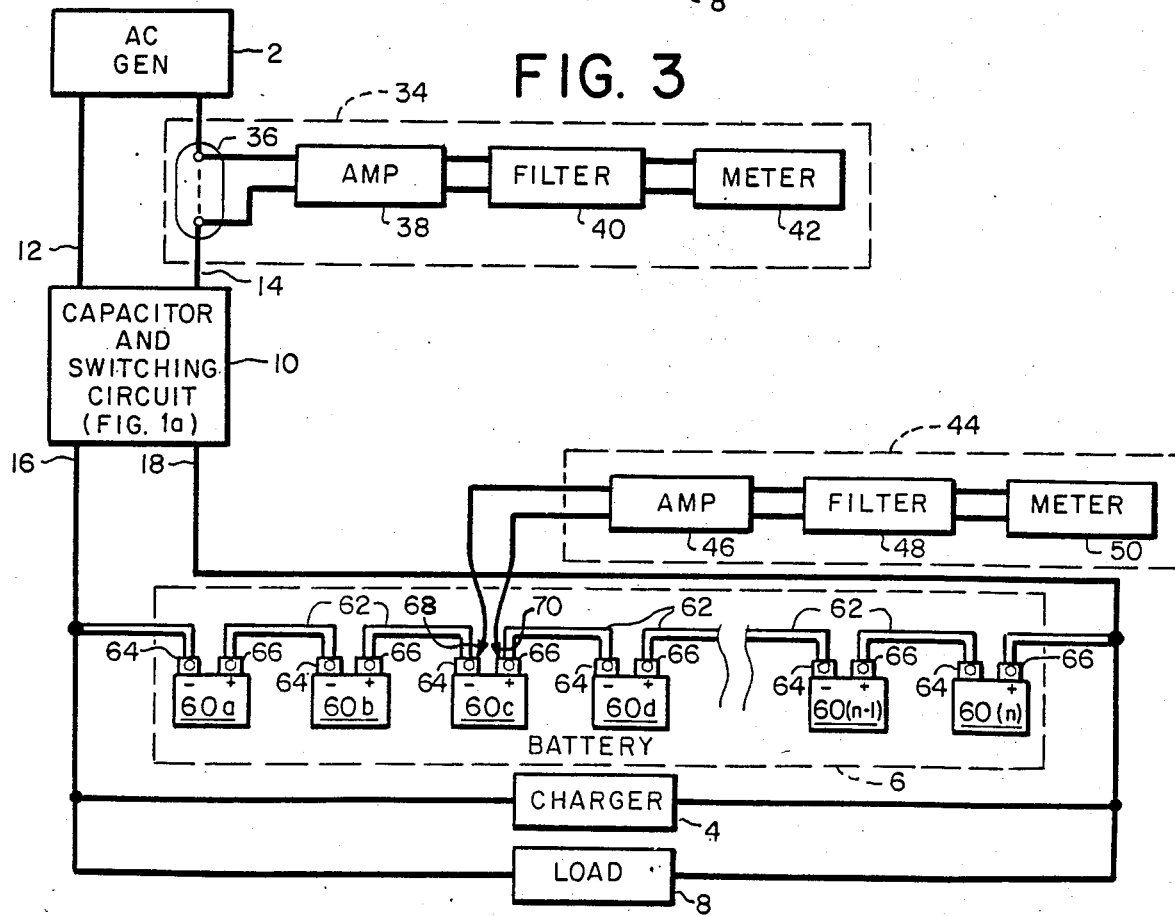
FIG. 3 is a schematic circuit diagram of a third preferred embodiment which can be used as a diagnostic tool to measure the impedance of individual battery components.

FIG. 3 shows the third preferred embodiment of this invention adapted to locate the particular cell or interconnection of the battery 6 characterized by a high impedance. Elements 2-50 of this preferred embodiment can be identical with the corresponding elements of the first preferred embodiment of FIG. 1, and will not be described again here.

As shown in FIG. 3, the battery 6 includes a plurality of individual battery cells 60a, 60b ... 60n. Each battery cell defines two output terminals 64,66, and adjacent battery cells are interconnected by an intercell conductor 62. In the embodiment of FIG. 3, the two inputs to the amplifier 46 are connected to respective probes 68,70. These probes 68,70 are preferably of the type having spring-loaded contact points which twist as they are pushed against the metal terminals. This approach assures a consistent, low resistance probe contact. Probes supplied by James G. Biddle Company of Plymouth Meeting, Pa. as Model No. 241001-7 have been found suitable. Preferably, the voltmeter 44 should be adjusted to provide a fast response and settling time and should be capable of displaying values as low as 100 microvolts.

In use, the embodiment of FIG. 3 operates to measure impedances having lower values than those of the entire battery 6. For this reason, it has been found preferable to increase the magnitude of the AC current supplied by the generator 2 to about 10 amperes for tests involving individual cells 60 and terminals 64,66. Impedance values of individual 2-volt cells 60 range from about typical values of about 10 milliohms for the type of battery used in many substations to about 0.3 milliohms for large batteries of the type used in stations. The impedance of battery connections is typically on the order of 10 to 200 microhms. When the amperage of the AC signal generated by the AC generator 2 is maintained at 10 amperes, voltage readings of the voltmeter 44 typically vary in the range of 3-100 millivolts for cell impedances and in the range of 0.1-2 millivolts for intercell connections. As suggested above, the current output of the generator 2 can be regulated in order to minimize calculations required to convert the reading of the voltmeter 44 to an impedance value. Alternately, an unregulated AC generator 2 can be used and the reading of the voltmeter 44 can simply be divided by the reading of the ammeter 34, either manually or automatically.

Figure 4:
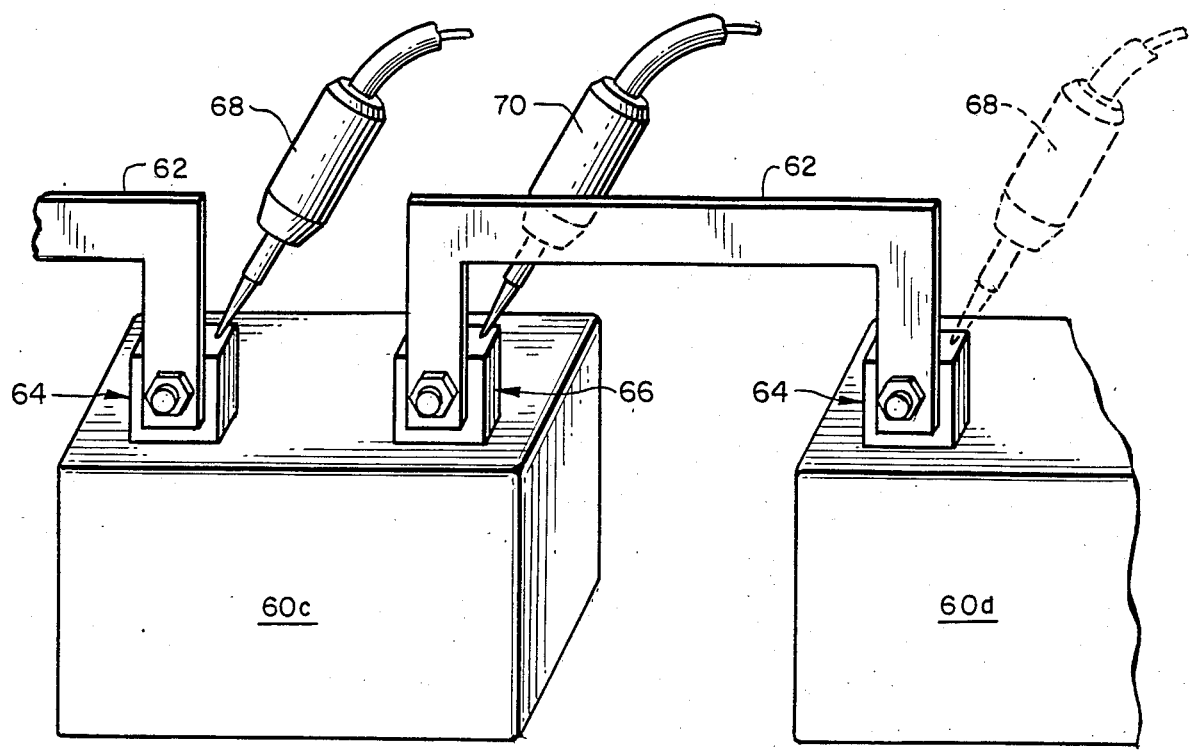
FIG. 4 is a partial perspective view of the battery diagnostic tool of FIG. 3 connected to measure the overall impedance of a battery cell.
Figure 5:
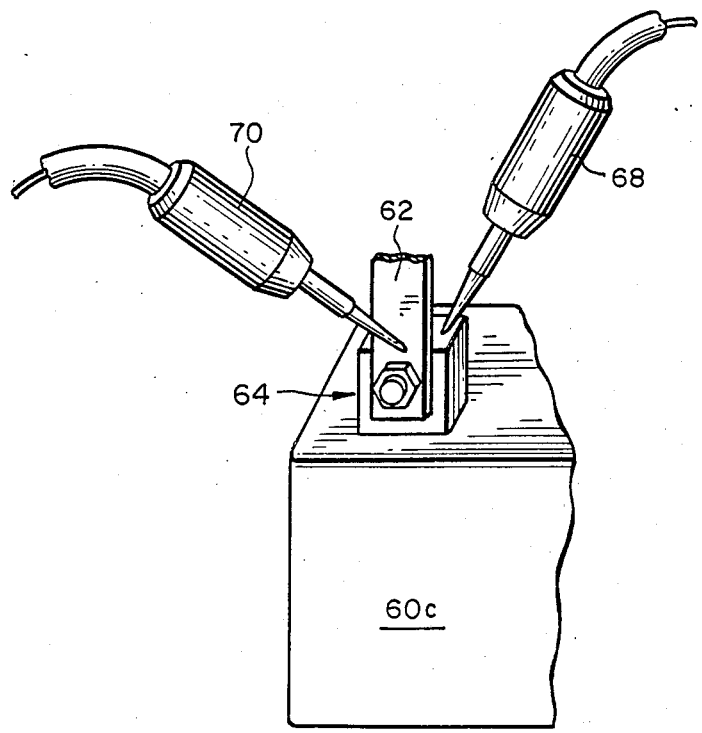
FIG. 5 is a partial perspective view of the battery diagnostic tool of FIG. 3 connected to measure the impedance of a single electrical connection of an intercell connector.

FIGS. 4 and 5 illustrate a method for testing the impedance of the individual cells 60 and the individual intercell connections of the battery 6. In order to measure the impedance of an individual cell 60 such as the cell 60c of FIG. 4, the probes 68,70 are pushed against the terminals 64,66, respectively. Then the current and voltage measurements of the ammeter 34 and the voltmeter 44 are noted and recorded and used to determine the impedance of the cell 60c.

The impedance of the intercell connection between adjacent cells 60c,60d can then be measured simply by moving the probe 68 from the position shown in solid lines in FIG. 4 to the position shown in dotted lines in FIG. 4, leaving the other probe 70 in place on the terminal 66 of the cell 60c. The measured values of current and voltage as indicated by the ammeter 34 and the voltmeter 44 are then noted and recorded in order to determine the impedance of the intercell connection.

The above procedure is then repeated for each individual cell and each intercell connection. To obtain the next measurement of cell impedance, the probe 70 is moved from the terminal 66 of the cell 60c to the terminal 66 of the cell 60d. Readings are then recorded as previously described. Of course, in the event a regulated generator 2 is used, it may not be necessary to record the current measured by the ammeter 34 for each test.

Once impedances have been calculated for each individual cell 60 and each intercell connection, the arithmetic mean impedance for the cells 60 is determined along with the arithmetic mean impedance for the intercell connections. Cells or intercell connections having impedances that differ from the corresponding arithmetic mean by more than 15% should preferably be investigated further to determine the cause of the increased impedance, such a cell deterioration or intercell connection corrosion.

In the event the impedance of an intercell connection between adjacent cells is more than 15% greater than the arithmetic mean, the cause is likely to be at one or both of the electrical interconnections between the terminals 64,66 and the intercell conductor 62. FIG. 5 illustrates the use of the probes 68,70 to measure the impedance of such an electrical interconnection. One of the probes 68 is placed on the corresponding terminal 64 of the cell 60 and the other of the probes 70 is placed on the intercell conductor 62. The measured impedance of any one of these electrical interconnections is then compared with identical interconnections at other cells to determine which connection is causing the measured increase in intercell impedance. Of course, other measurement procedures can be used depending upon the physical layout of the battery installation and its connections.

From the foregoing, it should be apparent that an improved apparatus and method have been described for monitoring and diagnosing the condition of a battery. In all embodiments, an AC generator is used to generate an AC current at a selected frequency which does not correspond to any characteristic frequency of the charger-load circuit in which the battery to be tested is connected. Voltage and current measurements are then made via respective bandpass filters which are tuned to the frequency of the AC generator and which block AC signals at the characteristic frequencies of the charger-load circuit. In this way, a reliable measure of battery impedance can be obtained simply and quickly, while the battery remains connected to both the charger and the load.

In the embodiments described above, the filters 40,48 have been described as bandpass filters. It should be understood that it is not necessary in all applications that bandpass filters be used. As an alternative, in the event the frequency of the AC generator is sufficiently low, and in the event there are no significant frequencies of the charger-load circuit below the frequency of the AC generator, then a low-pass filter may be substituted for the bandpass filters described above. Of course, the particular apparatus used to measure voltage or current, the particular AC generator, and the particular structure of the capacitor and switching circuit can all be modified as appropriate for the particular application. Furthermore, it is not critical in all applications that the measured parameters correspond directly to voltage and current. Any other Ohms-law-related parameter which varies as a function of the impedance of the battery being tested, such as dissipated power across a resistance for example, can be substituted as desired.

It is therefore intended that the foregoing detailed description be regarded as illustrative rather than limiting, and that it be understood that it is the following claims, including all equivalents, which are intended to define the scope of this invention.

We claim:

1. A battery monitor comprising:
   a. an AC signal generator adapted to generate an AC signal at a selected frequency;
   b. means for applying the AC signal across a first pair of contacts of a battery;
   c. means for determining first and second Ohms-law-related parameters indicative of impedance across a second pair of contacts of the battery, said determining means comprising:
   first means for supplying a first input signal indicative of the first Ohms-law-related parameter;
   first filter means coupled to the first supplying means for passing components of the first input signal at the selected frequency and for attenuating at least components of the first input signal in a first attenuation frequency range greater than the selected frequency, said filter means operating to generate a first filtered output signal; and
   first means for measuring said first filtered output signal to determine said first Ohms-law-related parameter.

2. The invention of claim 1 wherein said first and second Ohms-law-related parameters correspond to voltage and current, respectively, wherein said first input signal corresponds to voltage across said second pair of contacts, and wherein the measuring means measures the voltage of the input signal as filtered by the filter means.

3. The invention of claim 2 wherein the determining means regulates the second Ohms-law-related parameter to a predetermined value.

4. The invention of claim 1 wherein the determining means further comprises:
   second means for supplying a second input signal indicative of said second Ohms-law-related parameter;
   second filter means connected to said second supplying means for passing components of the second input signal at the selected frequency and for attenuating at least components of the second input signal in a second attenuation frequency range greater than the selected frequency, said second filter means operating to generate a second filtered output signal; and
   second means for measuring said second filtered output signal to determine said second Ohms-law-related parameter.

5. The invention of claim 4 wherein said first and second attenuation frequency ranges are identical.

6. The invention of claim 4 further comprising:
   means for automatically combining the first and second Ohms-law-related parameters to determine said impedance.

7. The invention of claim 1 wherein the first pair of contacts is one and the same with the second pair of contacts.

8. The invention of claim 1 wherein the battery comprises a pair of output contacts, wherein the battery comprises a plurality of cells, each having a pair of output contacts, wherein the first pair of contacts corresponds to the output contacts of the battery, and wherein the second pair of contacts corresponds to the output contacts of one of the cells.

9. The invention of claim 1 further comprising means for blocking DC current flow through a circuit comprising the battery and the AC signal generator.

10. The invention of claim 1 further comprising a battery charger and an active load, connected in parallel with one another across the battery.

11. The invention of claim 1 wherein said selected frequency is in the range of 11-14 Hz.

12. The invention of claim 1 wherein said selected frequency is in the range of 21-29 Hz.

13. The invention of claim 1 wherein said selected frequency is in the range of 91-109 Hz.

14. The invention of claim 1 wherein said first filter means comprises a bandpass filter centered at the selected frequency and operative to attenuate signals having frequencies above and below the selected frequency.

15. The invention of claim 1 wherein the AC signal is sinusoidal in waveform.

16. A battery monitor for a battery which is electrically interconnected with both a battery charger and an active load, wherein said battery charger and said active load cause AC currents in said battery at a plurality of characteristic frequencies, and wherein the battery comprises a plurality of terminals, said battery monitor comprising:
   a. an AC signal generator operative to generate an AC signal at a selected frequency, different from all of the characteristic frequencies;
   b. means for applying said AC signal across a first pair of terminals included in said plurality of terminals;
   c. means for supplying a first input signal characteristic of current flowing through the battery;
   d. means for measuring the first input signal to determine said first Ohms-law-related parameter characteristic of battery impedance at said selected frequency across a second pair of terminals included in said plurality of terminals, said measuring means comprising a first filter means operative to pass AC components of said first input signal at the selected frequency and to attenuate AC components of said first input signal in an attenuating frequency range which includes the plurality of characteristic frequencies and which extends at least above the selected frequency; and
   e. means for determining a second Ohms-law-related parameter characteristic of battery impedance at said selected frequency across said second pair of terminals.

17. The invention of claim 16 wherein said first and second Ohms-law-related parameters correspond to voltage and current, respectively, wherein said first input signal corresponds to voltage across said second pair of selected terminals, and wherein the measuring means measures the voltage of the input signal as filtered by the filter means.

18. The invention of claim 16 wherein the determining means regulates the second Ohms-law-related parameter to a predetermined value.

19. The invention of claim 16 wherein the determining means further comprises:
   second means for supplying a second input signal indicative of said second Ohms-law-related parameter;
   second filter means operative to pass AC components of said second input signal at the selected frequency and to attenuate AC components of said second input signal in said attenuating frequency range; and second means for measuring the AC components of the second input signal passed by the second filter means to determine said second Ohms-law-related parameter at said selected frequency.

20. The invention of claim 19 further comprising:

means for automatically combining the first and second Ohms-law-related parameters to determine said impedance.

21. The invention of claim 16 wherein said first pair of terminals is one and the same with said second pair of terminals.

22. The invention of claim 16 wherein the battery comprises a plurality of cells, wherein the plurality of terminals comprises a pair of battery output terminals and a plurality of pairs of cell output terminals, wherein the first pair of terminals corresponds to the battery output terminals, and wherein the second set of terminals corresponds to one of the pairs of cell output terminals.

23. The invention of claim 16 wherein the applying means comprises means for blocking DC current flow between the battery and the AC signal generator.

24. The invention of claim 16 wherein said selected frequency is in the range of 11-14 Hz.

25. The invention of claim 16 wherein said selected frequency is in the range of 21-29 Hz.

26. The invention of claim 16 wherein said selected frequency is in the range of 91-109 Hz.

27. The invention of claim 16 wherein the first filter means comprises a bandpass filter centered at the selected frequency and wherein the attenuating frequency range extends above and below the selected frequency.

28. The invention of claim 16 wherein the AC signal is sinusoidal in waveform.

29. A battery monitor for a battery which is electrically interconnected with both a battery charger and an active load, wherein said battery charger and said active load cause AC currents in said battery at a plurality of characteristic frequencies, and wherein the battery comprises a plurality of terminals, said battery monitor comprising:

a. an AC signal generator operative to generate an AC signal at a selected frequency, different from all of the characteristic frequencies;

b. means for applying said AC signal across a first pair of terminals included in said plurality of terminals;

c. an ammeter coupled to said applying means to generate a current measurement indicative of the magnitude of the AC current applied to the battery at said selected frequency, said ammeter comprising:

means, coupled to the applying means, for developing a first input signal indicative of the magnitude of current applied to the battery by the AC signal generator;

a first bandpass filter centered on said selected frequency and operative to pass components of the first input signal at said selected frequency and to attenuate components in an attenuating range which extends above and below said selected frequency range and which includes said plurality of characteristic frequencies; and means for measuring the magnitude of the first input signal as filtered by the first bandpass filter;

d. a voltmeter coupled to said battery to generate a voltage measurement indicative of the magnitude of the AC voltage across a second pair of terminals of the battery, said voltmeter comprising:

means, coupled to the second pair of terminals, for developing a second input signal indicative of the voltage across the second pair of terminals;

a second bandpass filter centered on said selected frequency and operative to pass components of said second input signal at said selected frequency and to attenuate components in said attenuating frequency range; and means for measuring the magnitude of the second input signal as filtered by the second bandpass filter.

30. The invention of claim 29 further comprising means for automatically combining the voltage measurement and the current measurement to determine the impedance.

31. The invention of claim 29 wherein the first pair of terminals is one and the same with the second pair of terminals.

32. The invention of claim 29 wherein the battery comprises a plurality of cells, wherein the plurality of terminals comprises a pair of battery output terminals and a plurality of pairs of cell output terminals, wherein the first pair of terminals corresponds to the battery output terminals, and wherein the second set of terminals corresponds to one of the pairs of cell output terminals.

33. The invention of claim 29 wherein the applying means comprises means for blocking DC current flow between the battery and the AC signal generator.

34. The invention of claim 29 wherein said selected frequency is in the range of 11-14 Hz.

35. The invention of claim 29 wherein said selected frequency is in the range of 21-29 Hz.

36. The invention of claim 29 wherein said selected frequency is in the range of 91-109 Hz.

37. The invention of claim 29 wherein said AC signal is sinusoidal in waveform.

38. A method for comparing the impedance of a plurality of components of a battery while said battery is electrically connected to a charger and an active load, said battery comprising a pair of battery output terminals and a plurality of cells electrically connected between the battery output terminals, each of said components comprising a pair of electrical contacts, said method comprising the following steps:

a. passing an AC current of a known magnitude through the battery across the battery output terminals, said AC current having a selected frequency;

b. obtaining a first voltage signal indicative of the AC voltage across the pair of electrical contacts of a first one of the components;

c. passing the first voltage signal through a filter operative to pass components of the first voltage signal at the selected frequency and to attenuate components of the first voltage signal in an attenuation frequency range which includes frequencies greater than the selected frequency;

d. measuring the first voltage signal as filtered in step (c) to obtain a first voltage measurement;

e. combining the first voltage measurement with the known magnitude of the current to obtain a first impedance value;

f. repeating steps (b) through (e) with a second voltage signal indicative of the AC voltage across the pair of electrical contacts of a second one of the components to obtain a second impedance value; and g. comparing the first and second impedance values.

39. The method of claim 38 wherein each of the components comprises a respective cell, and wherein the first and second impedance values correspond to the impedance of the respective cells.

40. The method of claim 38 wherein each of the components comprises a respective intercell conductor, and wherein the first and second impedance values correspond to the impedance of respective intercell connections.

41. The method of claim 38 wherein each of the components comprises a respective electrical connection, and wherein the first and second impedance values correspond to the impedance of the respective electrical connections.

42. The method of claim 38 wherein said selected frequency is in the range of 11-14 Hz.

43. The method of claim 38 wherein said selected frequency is in the range of 21-29 Hz.

44. The method of claim 38 wherein said selected frequency is in the range of 91-109 Hz.

45. The method of claim 38 wherein the filter of step (c) is a bandpass filter centered at the selected frequency and wherein the attenuation frequency range extends above and below the selected frequency.

46. The method of claim 38 wherein the charger and the active load cause additional AC currents at characteristic frequencies to pass through the battery, wherein the characteristic frequencies are spaced from the selected frequency, and wherein the filter of step (c) attenuates all of the characteristic frequencies.

47. The method of claim 38 wherein the AC current is sinusoidal in waveform.

* * * * *